United States Patent
Naka et al.

(10) Patent No.: US 7,394,417 B2
(45) Date of Patent: Jul. 1, 2008

(54) A/D CONVERTER

(75) Inventors: Junichi Naka, Osaka (JP); Koji Sushihara, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 11/629,402

(22) PCT Filed: Apr. 20, 2006

(86) PCT No.: PCT/JP2006/308286

§ 371 (c)(1),
(2), (4) Date: Dec. 13, 2006

(87) PCT Pub. No.: WO2006/132036

PCT Pub. Date: Dec. 14, 2006

(65) Prior Publication Data

US 2008/0030392 A1    Feb. 7, 2008

(30) Foreign Application Priority Data

Jun. 10, 2005   (JP) ............................. 2005-170626

(51) Int. Cl.
*H03M 1/00* (2006.01)
(52) U.S. Cl. ........................ 341/139; 341/155
(58) Field of Classification Search ............... 341/139, 341/155, 120
See application file for complete search history.

(56) References Cited

U.S. PATENT DOCUMENTS

| | | | |
|---|---|---|---|
| 6,480,132 B1 * | 11/2002 | Yoshioka et al. ............ | 341/155 |
| 6,707,333 B2 | 3/2004 | Matsumoto et al. | |
| 6,707,413 B2 | 3/2004 | Sushihara et al. | |
| 6,734,817 B2 | 5/2004 | Naka et al. | |
| 2003/0048213 A1 | 3/2003 | Sushihara et al. | |

(Continued)

FOREIGN PATENT DOCUMENTS

JP    2003-158456 A    5/2003

(Continued)

OTHER PUBLICATIONS

Kouji Sushihara, et al., "A 6b 800MSample/s CMOS A/D Converter," 2000 IEEE International Solid-State Circuits Conference, 2000, pp. 428-429, Session 26, Paper WP 26.2, IEEE.

(Continued)

*Primary Examiner*—Rexford Barnie
*Assistant Examiner*—Joseph Lauture
(74) *Attorney, Agent, or Firm*—McDermott Will & Emery LLP

(57) ABSTRACT

In an A/D converter, each preamp 102 includes a preamp gain adjusting circuit 109. The preamp gain adjusting circuit 109 suppresses the gain of the preamp 102 and restricts a positive-negative output potential difference of the preamp only when the positive-negative output potential difference of the preamp 102 exceeds a reference potential. Accordingly, in the case where the frequency of an input signal to the A/D converter is high, even when the gain of the preamp is increased due to fabrication process variation, temperature variation or supply voltage variation, output strain of the preamp is minimally caused, and the characteristic degradation of the A/D converter can be suppressed.

8 Claims, 13 Drawing Sheets

U.S. PATENT DOCUMENTS

2003/0128145 A1    7/2003    Naka et al.
2003/0174012 A1    9/2003    Matsumoto et al.

FOREIGN PATENT DOCUMENTS

| | | |
|---|---|---|
| JP | 2003-198368 A | 7/2003 |
| JP | 2003-273657 A | 9/2003 |
| JP | 3647806 | 2/2005 |

OTHER PUBLICATIONS

Koji Sushihara, et al., "A 7b 450MSample/s 50mW CMOS ADC in 0.3mm$^2$," ISSCC 2002 Visuals Supplement, 2002, pp. 130-131. Session 10, 10.3, IEEE.

* cited by examiner

FIG. 8
(a)
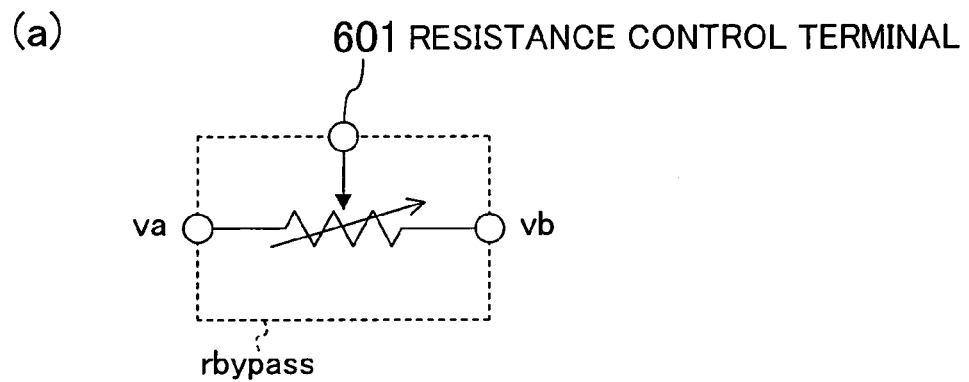
(b)
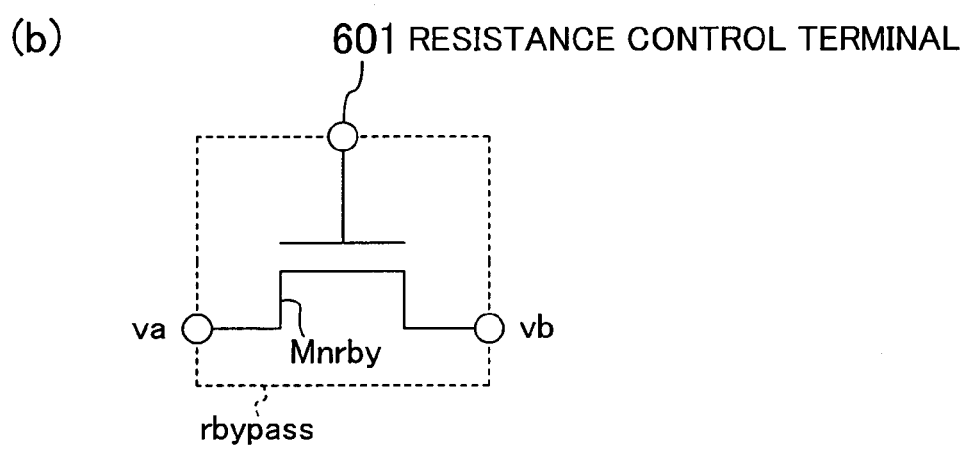
(c)
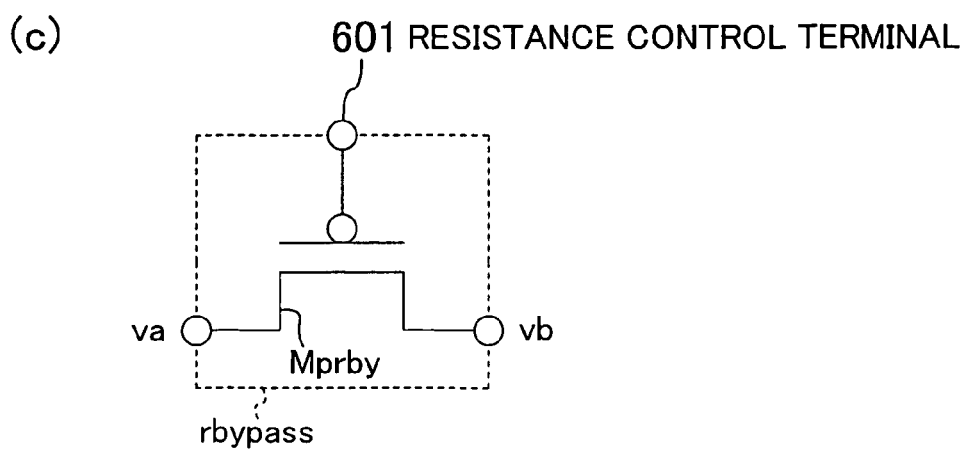

FIG. 13
(a) 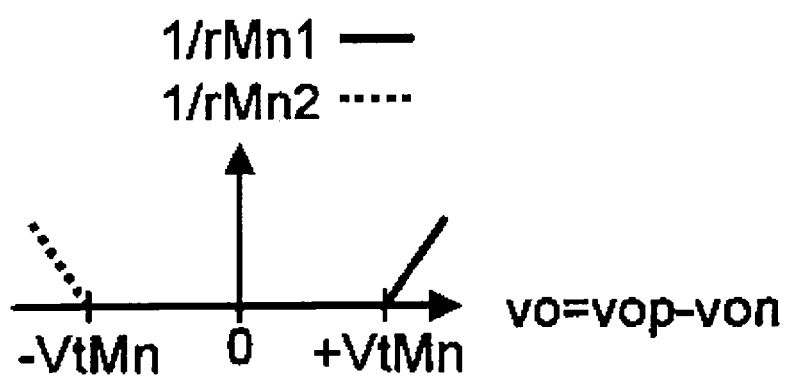
(b) 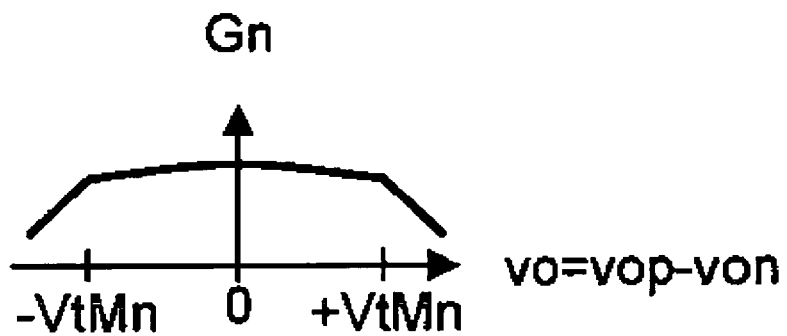
(c) 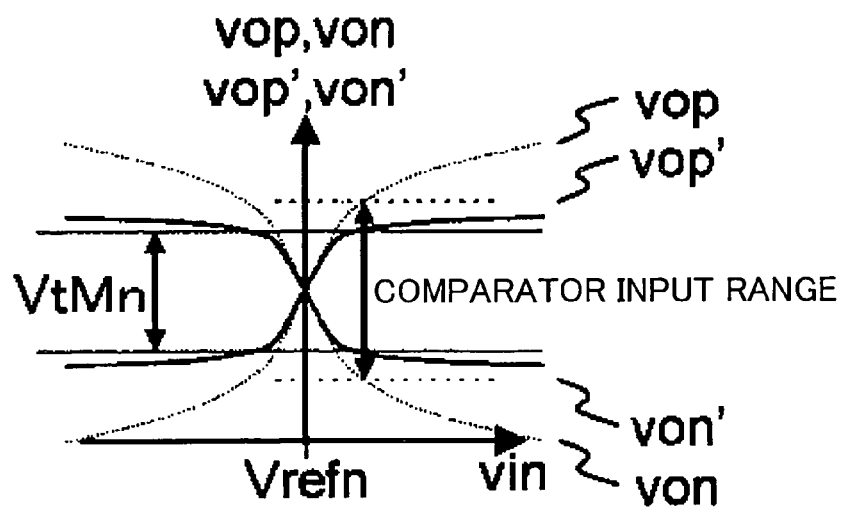

A/D CONVERTER

RELATED APPLICATIONS

This application is the U.S. National Phase under 35 U.S.C. § 371 of International Application No. PCT/JP2006/308286, filed on Apr. 20, 2006, which in turn claims the benefit of 2005-170626, filed on Jun. 10, 2005, the disclosures of which Applications are incorporated by reference herein.

TECHNICAL FIELD

The present invention relates to an A/D converter including a preamp row and a comparator row.

BACKGROUND ART

Conventionally, an A/D converter for realizing a fast operation, a small area and small power consumption includes, as shown in FIG. 14, a preamp row 1003 composed of one or more preamps 1002 at a previous stage of a comparator row 1005 composed of one or more comparators 1004. In many cases, the comparator row 1005 performs comparison while interpolating the output voltage of the preamp row 1003. The effects attained by providing the preamp row 1003 at the previous stage of the comparator row 1005 and by performing the comparison while interpolating the output voltage of the preamp row 1003 are that the input capacity of the A/D converter can be reduced first, that the offset of each comparator can be reduced secondly and that the input dynamic range of each comparator 1004 can be set large thirdly (see, for example, Non-patent Document 1 and Non-patent Document 2 for these effects).

Non-patent Document 1: Koji Sushihara and four others, "A 6b 800M Sample/s CMOS A/D Converter", 2000 Feb. 7-9, ISSCC2000/SESSION 26/ANALOG TECHNIQUES/PAPER WP 26.2

Non-patent Document 2: Koji Sushihara, Akira Matsuzawa, "A 7b 450M Sample/s 50 mW CMOS ADC in 0.3 mm^2", 2002 Feb. 3-7, ISSCC2002/SESSION 10/HIGH-SPEED ADCs/10.3

DISCLOSURE OF THE INVENTION

Problems to be Solved by the Invention

In order to reduce the offset of each comparator of an A/D converter, it is necessary to increase the gain of a preamp.

In the conventional A/D converter, however, when the gain of the preamp is too high due to fabrication process variation, temperature variation and supply voltage variation, a potential difference between the positive output and the negative output of the preamp, namely, a positive-negative output potential difference, is excessively oscillated, and the output of the preamp is easily strained as the frequency of an input signal of the A/D converter is higher. Therefore, even when a positive output and a negative output of the preamp obtained in the vicinity of their crosspoint are interpolated by the comparator row, a large error is caused due to the strain of the preamp, and hence, the characteristics of the A/D converter are degraded. Similarly, when the output range of the preamp is too large as compared with the input range of the comparator because the gain of the preamp is too high, the response characteristic of the comparator is degraded, and hence, the characteristics of the A/D converter are degraded.

An object of the invention is, in an A/D converter including a preamp row and a comparator row, suppressing the characteristic degradation of the A/D converter by preventing the gain of a preamp from being too high.

Means for Solving the Problems

In order to achieve the object, according to the present invention, in an A/D converter including a preamp row and a comparator row, each preamp is correspondingly provided with a preamp gain adjusting circuit, so as to monitor the output voltage of a differential output terminal of the corresponding preamp, and to reduce the gain of the corresponding preamp when the output voltage of the corresponding preamp exceeds a given reference voltage.

Specifically, the A/D converter of this invention includes a preamp row including one or more preamps and a comparator row including one or more comparators, each preamp of the preamp row receives, as inputs, a reference voltage or difference-reference voltages and an analog input signal or differential analog input signals and has a positive output terminal and a negative output terminal, the preamp has a function to multiply, by a gain thereof, a potential difference between the reference voltage and the analog input signal or a potential difference between a potential difference between the difference-reference voltages and a potential difference between the differential analog input signals and to output the potential difference having multiplied by the gain from the positive output terminal and the negative output terminal as differential outputs, each comparator of the comparator row is connected to the positive output terminal and the negative output terminal of each preamp, the comparator has a function to compare an output of the preamp with a comparing reference voltage, or to interpolate output voltages of the positive output terminals and the negative output terminals of two or more preamps adjacent to each other and compare the interpolated voltages, each of the preamps is correspondingly provided with a preamp gain adjusting circuit, and the preamp gain adjusting circuit reduces the gain of the corresponding preamp when a preamp positive-negative output potential difference that is a potential difference between the positive output terminal and the negative output terminal of the corresponding preamp exceeds a reference potential.

In the A/D converter of the invention, the preamp gain adjusting circuit includes a preamp positive-negative output potential difference-reference potential comparator for comparing the preamp positive-negative output potential difference and the reference potential with each other and outputting a preamp positive-negative output potential difference-reference potential comparing signal; and a sub-bias circuit for generating a bias voltage to be supplied to a bias current source included in the corresponding preamp, and the sub-bias circuit changes a bias current of the bias current source by changing the bias voltage to be supplied to the bias current source of the corresponding preamp, whereby changing the gain of the corresponding preamp.

In the A/D converter of the invention, the preamp gain adjusting circuit includes a preamp positive-negative output potential difference-reference potential comparator for comparing the preamp positive-negative output potential difference and the reference potential with each other and outputting a preamp positive-negative output potential difference-reference potential comparing signal; and one or more variable resistors, and each of the variable resistors has two input/output terminals and a resistance control terminal, one of the input/output terminals of the variable resistor is connected to the positive output terminal of the preamp, the other of the input/output terminals of the variable resistor is connected to the negative output terminal of the preamp and the resistance control terminal of the variable resistor receives the positive-negative output potential difference-reference potential comparing signal of the corresponding preamp, and an ON resistance of the variable resistor is changed in accordance with the positive-negative output potential difference-reference potential comparing signal received at the resistance control terminal of the variable resistor, whereby changing the gain of the corresponding preamp.

In the A/D converter of the invention, each of the variable resistors includes one N-channel MOS transistor, a source terminal or a drain terminal of the N-channel MOS transistor is connected to the positive output terminal of the corresponding preamp, the drain terminal or the source terminal thereof is connected to the negative output terminal of the corresponding preamp and a gate electrode thereof receives the preamp positive-negative output potential difference-reference potential comparing signal, and an ON resistance of the N-channel MOS transistor is changed in accordance with the preamp positive-negative output potential difference-reference potential comparing signal received at the gate terminal, whereby changing the gain of the corresponding preamp.

In the A/D converter of the invention, each of the variable resistor includes one P-channel MOS transistor, and a source terminal or a drain terminal of the P-channel MOS transistor is connected to the positive output terminal of the corresponding preamp, the drain terminal or the source terminal thereof is connected to the negative output terminal of the corresponding preamp and a gate electrode thereof receives the preamp positive-negative output potential difference-reference potential comparing signal, and an ON resistance of the P-channel MOS transistor is changed in accordance with the preamp positive-negative output potential difference-reference potential comparing signal received at the gate terminal, whereby changing the gain of the corresponding preamp.

In the A/D converter of the invention, the preamp gain adjusting circuit includes two N-channel MOS transistors, and one of the two N-channel MOS transistors is connected to the positive output terminal of the corresponding preamp at a source terminal or a drain terminal thereof and is connected to the negative output terminal of the corresponding preamp at the drain terminal or the source terminal and a gate terminal thereof, the other of the two N-channel MOS transistors is connected to the negative output terminal of the corresponding preamp at a source terminal or a drain terminal thereof and is connected to the positive output terminal of the corresponding preamp at the drain terminal or the source terminal and a gate terminal thereof, and the preamp gain adjusting circuit changes the gain of the corresponding preamp.

In the A/D converter of the invention, the preamp gain adjusting circuit includes two P-channel MOS transistors, and one of the two P-channel MOS transistors is connected to the positive output terminal of the corresponding preamp at a source terminal or a drain terminal thereof and is connected to the negative output terminal of the corresponding preamp at the drain terminal or the source terminal and a gate terminal thereof, the other of the two P-channel MOS transistors is connected to the negative output terminal of the corresponding preamp at a source terminal or a drain terminal thereof and is connected to the positive output terminal of the corresponding preamp at the drain terminal or the source terminal and a gate terminal thereof, and the preamp gain adjusting circuit changes the gain of the corresponding preamp.

In the A/D converter of the invention, the preamp gain adjusting circuit includes two N-channel MOS transistors and two P-channel MOS transistors, and one of the two N-channel MOS transistors is connected to the positive output terminal of the corresponding preamp at a source terminal or a drain terminal thereof and is connected to the negative output terminal of the corresponding preamp at the drain terminal or the source terminal and a gate terminal thereof, the other of the two N-channel MOS transistors is connected to the negative output terminal of the corresponding preamp at a source terminal or a drain terminal thereof and is connected to the positive output terminal of the corresponding preamp at the drain terminal or the source terminal and a gate terminal thereof, one of the two P-channel MOS transistors is connected to the positive output terminal of the corresponding preamp at a source terminal or a drain terminal thereof and is connected to the negative output terminal of the corresponding preamp at the drain terminal or the source terminal and a gate terminal thereof, the other of the two P-channel MOS transistors is connected to the negative output terminal of the corresponding preamp at a source terminal or a drain terminal thereof and is connected to the positive output terminal of the corresponding preamp at the drain terminal or the source terminal and a gate terminal thereof, and the preamp gain adjusting circuit changes the gain of the corresponding preamp.

In this manner, according to the present invention, in the case where the frequency of the analog input signal is higher, when the positive-negative output potential difference of each preamp included in the preamp row exceeds a given reference potential, the gain of the preamp is reduced by the preamp gain adjusting circuit. Therefore, strain of the output of the preamp is reduced, and characteristic degradation of the A/D converter is suppressed. In particular, the output range of the preamp can be made to fall within the input range of the comparator by appropriately setting the reference potential, and hence, the characteristic degradation of the A/D converter can be more definitely suppressed.

In particular, in adjusting the gain of the preamp in the present invention, the following operation is specifically performed: When the positive-negative output potential difference of the preamp is larger than the reference potential, a bias current of the sub-bias circuit is reduced in accordance with the preamp positive-negative output potential difference-reference potential comparing signal, so as to reduce the bias voltage to be supplied to the bias current source of the preamp. Therefore, the bias current passing through the preamp is reduced, so as to reduce the gain of the preamp.

Alternatively, in adjusting the gain of the preamp in the present invention, the following operation is specifically performed: When the positive-negative output potential difference of the preamp is larger than the reference potential, the resistance of the variable resistor is reduced in accordance with the preamp positive-negative output potential difference-reference potential comparing signal. Therefore, the potential difference between the positive output terminal and the negative output terminal of the preamp connected to the both ends of the variable resistor is reduced, so as to reduce the gain of the preamp.

Moreover, according to the present invention, when the positive-negative output potential difference between the positive output terminal and the negative output terminal of the preamp is larger than the threshold voltage of two N-channel or P-channel transistors connected therebetween, the resistance of the transistors is reduced. Therefore, the potential difference between the positive output terminal and the negative output terminal of the preamp is reduced, so as to reduce the gain of the preamp.

EFFECT OF THE INVENTION

As described so far, in the A/D converter of this invention, since the gain of the preamp is adjusted not to be too high by the preamp gain adjusting circuit, even when the frequency of the analog input signal is high, the output strain of the preamp can be reduced and the output range of the preamp can be made to fall within the input range of the comparator depending upon the setting the reference potential. As a result, an effect to effectively suppress the characteristic degradation of the A/D converter can be exhibited.

BRIEF DESCRIPTION OF DRAWINGS

FIG. 8 is a diagram for showing the configuration of a resistance variable bypass resistor included in the A/D converter.

FIG. 13A is a diagram for showing the characteristic of conductance of two N-channel MOS transistors in contrast to a positive-negative output potential difference of a preamp, FIG. 13B is a diagram for showing the characteristic of a gain of the preamp in contrast to the positive-negative output potential difference of the preamp, and FIG. 13C is a diagram for showing the characteristics of a positive output and a negative output of the preamp in contrast to an analog input signal.

DESCRIPTION OF REFERENCE NUMERALS

101 Reference voltage resistor row
102 Preamp
103 Preamp row
104 Comparator
105 Comparator row
106 Preamp positive-negative output potential difference-reference potential comparator
108 Sub-bias circuit
109 Preamp gain adjusting circuit
Mnb N-channel transistor (bias current source)
rbypass Resistance variable bypass resistor (variable resistor)

BEST MODE FOR CARRYING OUT THE INVENTION

Preferred embodiments of the invention will now be described with reference to the accompanying drawings.

Embodiment 1

First, the Configuration of an A/D Converter According to Embodiment 1 of the invention will be described. Herein, the configuration of an nth preamp included in a preamp row will be described.

Figure 1:
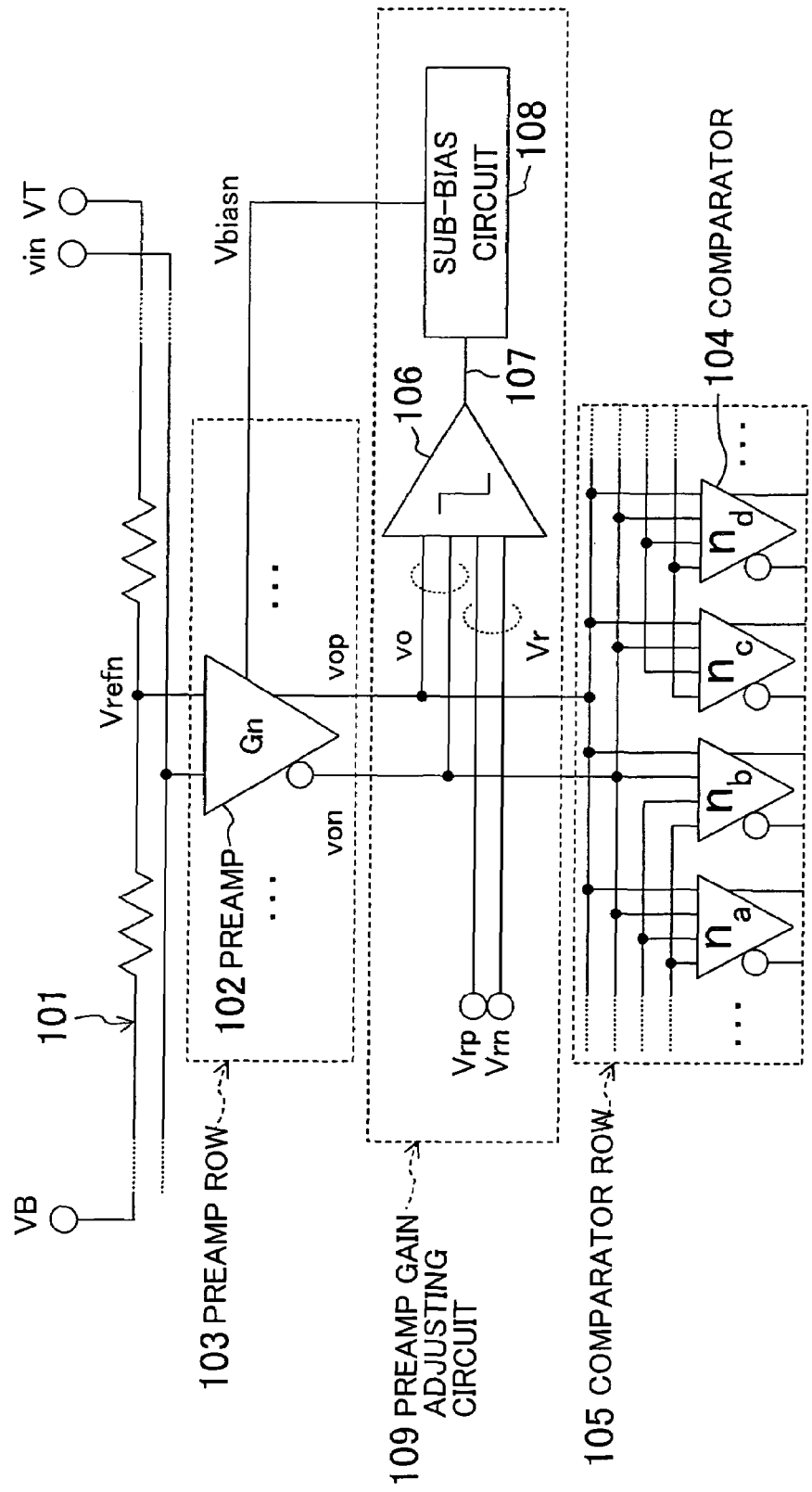
FIG. 1 is a diagram of an A/D converter according to Embodiment 1 of the invention.

FIG. 1 shows the whole configuration of the A/D converter according to Embodiment 1 of the invention. A reference voltage resistor row 101 is connected between minimum and maximum reference voltages VB and VT. An analog input signal vin and one reference voltage Vrefn generated by the reference voltage resistor row 101 are connected to a preamp 102. A preamp row 103 includes a group of preamps respectively receiving the analog input signal vin and different reference voltages. In this embodiment, each preamp 102 receives two inputs, that is, one analog input signal and one reference voltage, and has two output terminals, that is, a positive output terminal vop and a negative output terminal von. At this point, a potential difference between the positive output vop and the negative output von, namely, a positive-negative output potential difference of the preamp 102, is indicated as vo.

The two terminals of the positive output terminal vop and the negative output terminal von of the preamp 102 are connected to a comparator row 105 composed of one or more comparators 104. The comparator 104 interpolates the output voltages of the positive output terminals and the negative output terminals of two or more preamps 102 adjacent to each other and compares the interpolated output voltages. On the other hand, the positive output terminal vop and the negative output terminal von of the preamp 102 are connected to a preamp positive-negative output potential difference-reference potential comparator 106 together with two reference potentials Vrp and Vrn. At this point, a potential difference between the reference potentials Vrp and Vrn is indicated as Vr.

A preamp positive-negative output potential difference-reference potential comparing signal corresponding to the output of the preamp positive-negative output potential difference-reference potential comparator is input to a sub-bias circuit 108. The output vbiasn of the sub-bias circuit 108 is supplied as a bias voltage vbiasn of each preamp 102. A preamp gain adjusting circuit 109 is constructed from the preamp positive-negative output potential difference-reference potential comparator 106 and the sub-bias circuit 108. Since the preamp positive-negative output potential difference-reference potential comparator 106 can be constructed from a general differential signal comparator, description of the detailed circuit configuration is omitted.

Figure 2:
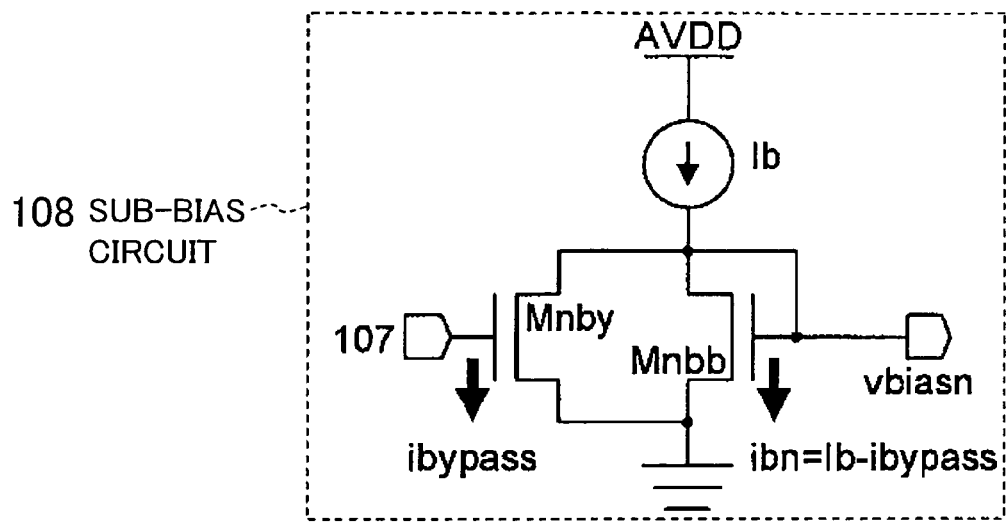
FIG. 2 is a diagram for showing the configuration of a sub-bias circuit included in the A/D converter.

FIG. 2 shows the sub-bias circuit 108 used in the A/D converter of this embodiment. A terminal on a current inlet side of a current source Ib for a reference current Ib is connected to a power supply ADVV, and a terminal on a current outlet side receives the output vbiasn of the sub-bias circuit 108. The gate terminal of an N-channel MOS transistor Mnby for allowing a bypass current ibypass to pass receives the preamp positive-negative output potential difference-reference potential comparing signal given as the input of the sub-bias circuit 108, the drain terminal thereof receives the output vbiasn of the sub-bias circuit 108, and the source terminal thereof receives a reference voltage VSS. The gate terminal and the drain terminal of an N-channel MOS transistor Mnbb for allowing a bias current ibn to pass receives the output vbiasn of the sub-bias circuit 108 and the source terminal thereof receives the reference voltage VSS. The bias current ibn corresponds to a current obtained by subtracting the bypass current ibypass from the reference current Ib (i.e., ibn=Ib−ibypass).

Figure 3:
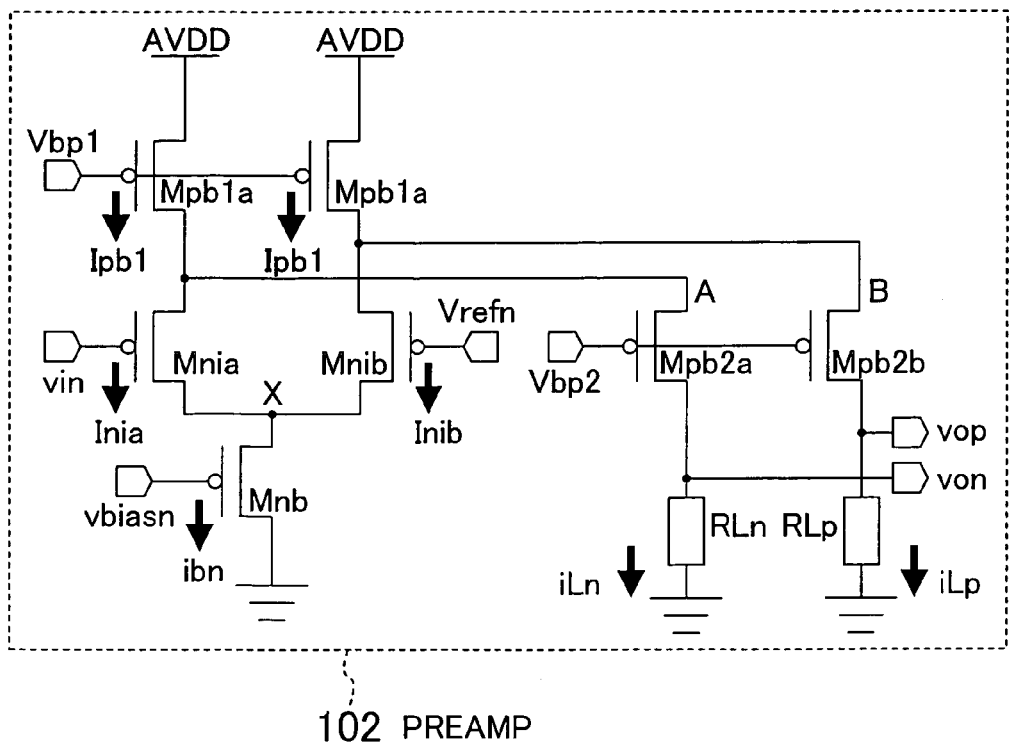
FIG. 3 is a diagram for showing the configuration of a preamp included in the A/D converter.

FIG. 3 shows the preamp 102 included in the A/D converter of this embodiment. The gate terminals of P-channel MOS transistors Mpb1a and Mpb1b for allowing a bias current Ipb1 to pass are both connected to a bias voltage Vbp1 for adjusting the operation point of the preamp 102, the source terminals thereof are both connected to the power supply AVDD, and the drain terminals thereof are respectively connected to nodes A and B. The gate terminals of N-channel transistors Mnia and Mnib corresponding to the input transistors of the preamp 102 for respectively allowing currents inia and inib to pass receive the analog input signal vin and the reference voltage Vrefn given as the inputs of the preamp 102, the source terminals thereof are both connected to a node X and the drain terminals thereof are respectively connected to the nodes A and B. The currents inia and inib respectively pass through the input transistors Mnia and Mnib of the preamp 102, and a synthetic current ibn of the currents inia and inib flows from an N-channel transistor (bias current source) Mnb. In the N-channel transistor Mnb, the gate terminal receives the bias voltage vbiasn corresponding to the output of the sub-bias circuit 108, the drain terminal is connected to the node X and the source terminal is grounded to be provided with the reference voltage VSS. The gate terminals of P-channel MOS transistors Mbp2a and Mbp2b for allowing output load currents iLn and iLp to pass both receive a bias voltage Vbp2 for adjusting the operation point of the preamp 102, the source terminals thereof are respectively connected to the nodes A and B, and the drain terminals thereof are respectively connected to the negative output terminal von and the positive output terminal vop of the preamp 102. One ends of resistors RLn and RLp corresponding to output load resistors respectively for allowing the output load currents iLn and iLp to pass are respectively connected to the negative output terminal von and the positive output terminal vop, and the other ends thereof are both connected to the reference potential VSS.

The above is the configuration of the A/D converter of this embodiment.

Next, the operation of the present A/D converter will be described. Herein, the operation related to the nth preamp 102 included in the preamp row 103 will be described.

Figure 4:
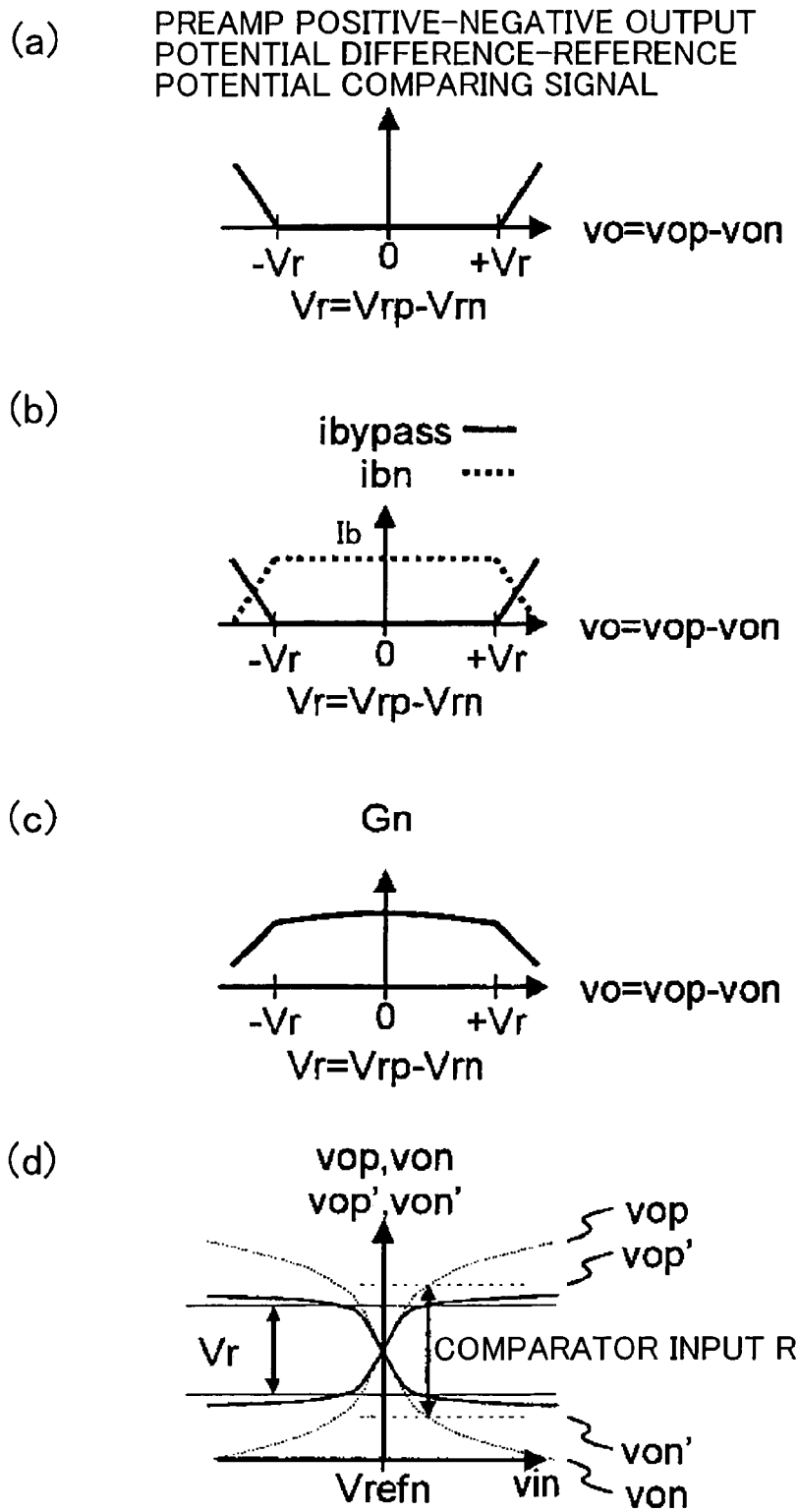
FIG. 4A is a diagram for showing the characteristic of a preamp positive-negative output potential difference-reference potential comparing signal in contrast to a positive-negative output potential difference of the preamp included in the A/D converter.
FIG. 4B is a diagram for showing the characteristics of a bypass current of the sub-bias circuit and a bias current of the preamp in contrast to the positive-negative output potential difference of the preamp.
FIG. 4C is a diagram for showing the characteristic of a gain of the preamp in contrast to the positive-negative output potential difference of the preamp.
FIG. 4D is a diagram for showing the characteristics of a positive output and a negative output of the preamp in contrast to an analog input signal.

FIG. 4A shows the characteristic of the preamp positive-negative output potential difference-reference potential comparing signal in contrast to the positive-negative output potential difference vo of the preamp 102, that is, the input/output characteristic of the preamp positive-negative output potential difference-reference potential comparator 106. Specifically, it is shown in this drawing that when the positive-negative output potential difference vo of the preamp 102 exceeds the potential difference Vr between the reference potentials Vrp and Vrn, the preamp positive-negative output potential difference-reference potential comparing signal increases in the positive direction.

FIG. 4B shows the characteristics of the bypass current ibypass and the bias current ibn of the sub-bias circuit 108 shown in FIG. 2 in contrast to the positive-negative output potential difference vo of the preamp 102. Specifically, when the positive-negative output potential difference vo of the preamp 102 exceeds the potential difference Vr between the reference potentials Vrp and Vrn and the preamp positive-negative output potential difference-reference potential comparing signal increases in the positive direction, the gate/source voltage of the N-channel MOS transistor Mnby of FIG. 2 increases and the bypass current ibypass corresponding to the drain/source current of the transistor Mnby increases. On the other hand, the drain/source current ibn of the transistor Mnbb obviously corresponds to Ib-ibypass, and when the positive-negative output potential difference vo of the preamp 102 exceeds the potential difference Vr between the reference potentials Vrp and Vrn and the preamp positive-negative output potential difference-reference potential comparing signal increases in the positive direction, the current ibn reduces correspondingly to the increase of the current ibypass. Therefore, the bias voltage vbiasn corresponding to the output of the sub-bias circuit 108 reduces when the positive-negative output potential difference vo of the preamp 102 exceeds the potential difference Vr between the reference potentials Vrp and Vrn and the preamp positive-negative output potential difference-reference potential comparing signal increases in the positive direction.

FIG. 4C shows the characteristic of a gain Gn of the preamp 102 shown in FIG. 3 in contrast to the positive-negative output potential difference vo of the preamp 102. The N-channel transistor Mnbb of the sub-bias circuit 108 and the N-channel transistor Mnb of the preamp 102 together form a current mirror circuit, and when the analog input signal vin is equal to the reference voltage Vrefn, the bypass current ibypass of the sub-bias circuit 109≈0. Therefore, the bias current ibn of the sub-bias circuit 109≈the current Ib, and the bias current is mapped by the current mirror circuit so that the bias current ibn of the preamp 102≈the current Ib. The sizes of the two transistors Mnbb and Mnb are the same and the mirror ratio is 1 in this embodiment, and the effect of the embodiment can be attained regardless of the mirror ratio. Furthermore, at this point, inia=inib=ibn/2=Ib/2. Furthermore, the gain Gn of the preamp 102 obtained at this point is represented as follows in assuming that the transistors Mnia and Mnib respectively have transconductances gma and gmb, which are equal to gm:

$$Gn = gm \cdot RL$$

(wherein $gm = gma = gmb = \sqrt{(\beta Ib)}$ and $RL = RLp = RLn$, whereas $\beta$ is a constant determined depending upon the transistor characteristics of the transistors Mnia and Mnib such as the sizes and the mobility). Furthermore, the positive output vop and the negative output von of the preamp 102 obtained in this case are as follows:

$$vop=von=iL \cdot RL=(Ipb1-Ib/2) \cdot RL$$

(iL=iLP=iLn and RL=RLp=RLn)

At this point, it is assumed that the analog input signal vin is increased. In accordance with the increase of the analog input signal vin, the positive-negative output potential difference vo of the preamp 102 is increased. However, when the positive-negative output potential difference vo of the preamp 102 exceeds the potential difference Vr between the reference potentials Vrp and Vrn and the preamp positive-negative output potential difference-reference potential comparing signal increases in the positive direction, the bias current ibn of the sub-bias circuit 108 reduces and the bias voltage vbiasn to be output has a smaller value as described above. Accordingly, the bias current ibn passing through the N-channel transistor (bias current source) Mnb is also reduced in the preamp 102. When the positive-negative output potential difference vo of the preamp 102 exceeds the potential difference Vr between the reference potentials Vrp and Vrn, the currents inia and inib passing through the input transistors Mnia and Mnib of the preamp 102 are in an unbalanced state. Therefore, although the gain Gn of the preamp 102 is already reduced as compared with the case where vin=Vrefn, since the gains of the transistors Mina and Minb are reduced because the bias current ibn of the preamp 102 is reduced, it is apparent that the gain Gn of the preamp 102 is reduced. Specifically, the gain Gn of the preamp 102 reduces when the positive-negative output potential difference vo of the preamp 102 exceeds the potential difference Vr between the reference potentials Vrp and Vrn and the preamp positive-negative output potential difference-reference potential comparing signal increases in the positive direction.

Comprehensively, FIG. 4D shows a positive output vop (a broken line) and a negative output von (a broken line) of the preamp 102 in contrast to the analog input signal vin obtained without providing the preamp gain adjusting circuit 109 and a positive output vop' (a solid line) and a negative output von' (a solid line) of the preamp 102 in contrast to the analog input signal vin obtained with the preamp gain adjusting circuit 109 provided. Specifically, owing to the function of the preamp gain adjusting circuit 109, the positive-negative output potential difference vo of the preamp 102 increases as the analog input signal vin increases, and when the positive-negative output potential difference vo of the preamp 102 exceeds the reference potential difference Vr, the gain of the preamp 102 is limited so as not to increase the positive output vop and the negative output von like the positive output vop' and the negative output von' shown with the solid lines as compared with the positive output vop and the negative output von shown with the broken lines. It is possible to design so that the positive output vop and the negative output von cannot exceed the input range of the comparator depending upon the setting of the potential difference Vr between the reference potentials Vrp and Vrn.

The above is the operation of the A/D converter of this embodiment.

In this embodiment, the A/D converter including the preamp row 103 and the comparator row 104 is provided with the preamp gain adjusting circuit 109, and therefore, when the positive-negative output potential difference vo of each preamp 102 exceeds the reference potential difference Vr, the gain Gn of each preamp 102 is reduced by the preamp gain adjusting circuit 109 so as to restrict the positive-negative output potential difference vo of the preamp 102. As a result, strain of the output of the preamp 102 is reduced. Also, depending upon the setting of the reference potentials, the output range of the preamp 102 can be prevented from exceeding the input range of the comparator.

In addition, the preamp gain Gn obtained in the vicinity of the crosspoint between the positive output vop and the negative output of the preamp 102 significant for the characteristics, namely, the preamp gain Gn obtained when the positive-negative output potential difference vo of the preamp 102 is within the potential difference Vr between the reference potentials Vrp and Vrn, is equivalent to that of an A/D converter or the like not provided with the preamp gain adjusting circuit 109, and hence, there is no factor for degrading the characteristics of the A/D converter.

As a result, as compared with the conventional A/D converter, the characteristics of the A/D converter can be prevented from degrading even when the frequency of an input signal is higher.

In this embodiment, it goes without saying that the method for generating the reference voltages used in the A/D converter, the preamp 102, the sub-bias circuit 108 and the comparator 104 are not particularly specified and are not limited to the above description but can be variously modified within the spirit of the invention.

Figure 5:
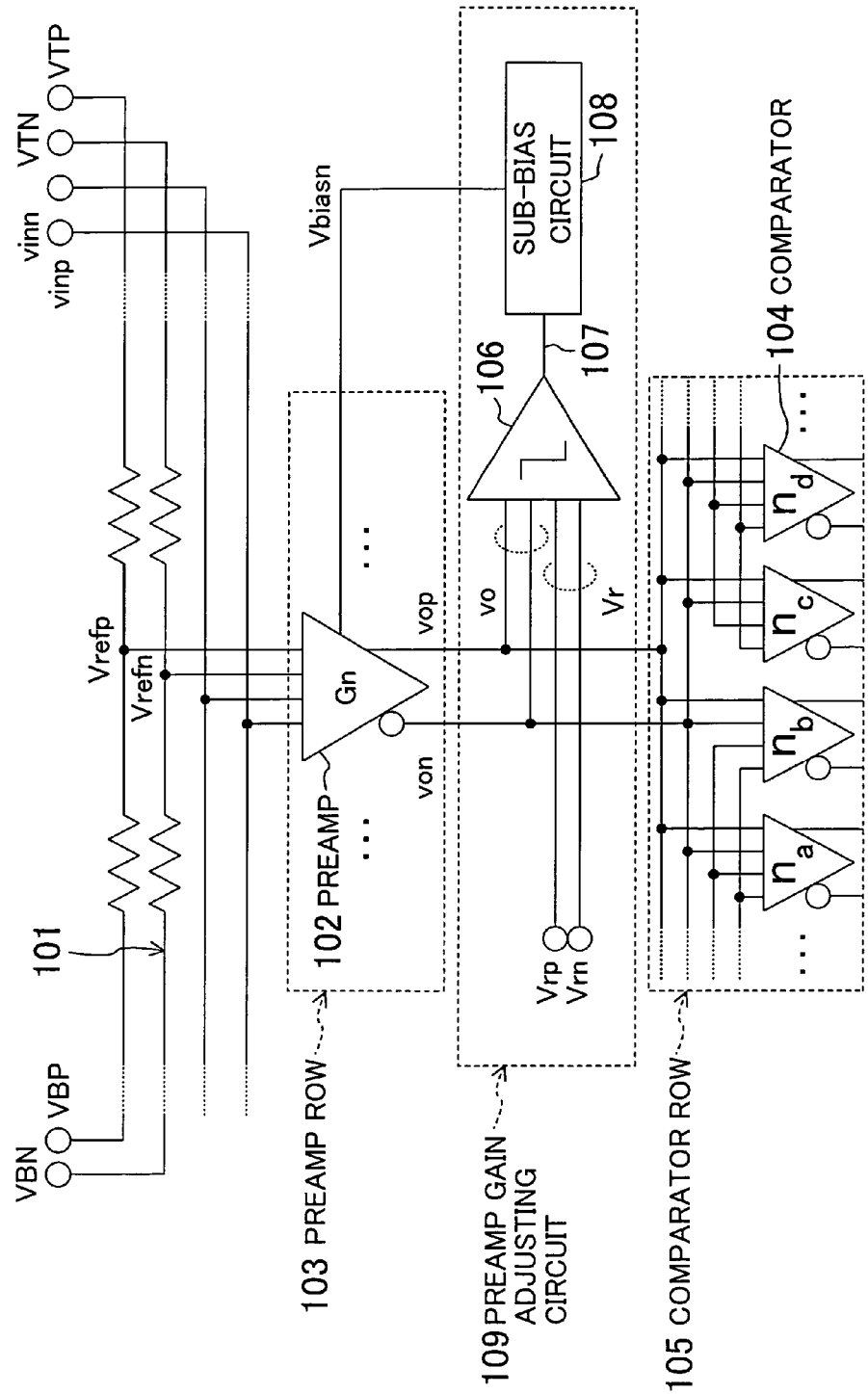
FIG. 5 is a diagram of a modification of the A/D converter.
Figure 6:
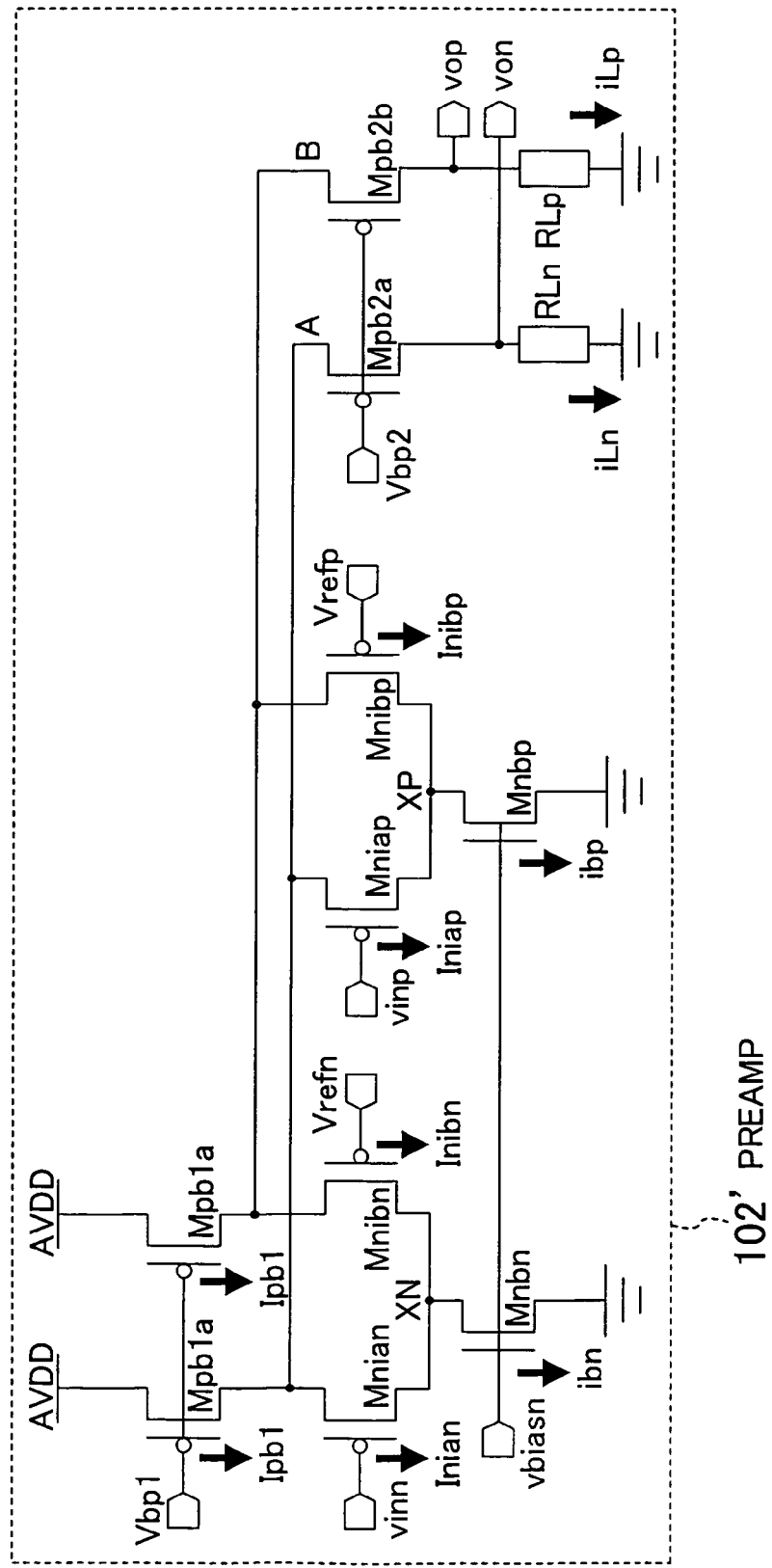
FIG. 6 is a diagram for showing the configuration of a preamp included in the A/D converter of FIG. 5.

For example, in the A/D converter shown in FIG. 1, although the analog input signal Vin and the reference signal Vrefn to be input to the preamp 102 are one each, the configuration of the preamp 102 is not limited to this but, for example, the preamp may receive, as its inputs, differential analog input signals composed of two analog input signals Vinn and Vinp complementary to each other and difference-reference signals composed of two reference signals Vrefn and Vregp complementary to each other. The whole configuration of such an A/D converter is shown in FIG. 5. Also, an example of the internal configuration of the preamp receiving the differential analog input signals and the difference-reference signals is shown in FIG. 6. In the preamp 102' shown in the drawing, N-channel transistors Mnian and Mnibn for receiving one analog input signal Vrefn out of the differential analog input signals and one differential signal Vinn out of the difference-reference signals are both connected to an N-channel transistor (bias current source) Mnbn, and N-channel transistors Mniap and Mnibp for receiving the other analog input signal Vrefp out of the differential analog input signals and the other differential signal Vinp out of the difference-reference signals are both connected to another N-channel transistor (bias current source) Mnbp. The gate terminals of the two bias current sources Mnbn and Mnbp both receive a bias voltage vbiasn, that is, the output of a sub-bias circuit 108. The operation of the preamp 102' of FIG. 6 is similar to the operation of the preamp 102 of FIG. 3 and hence the description is omitted.

Furthermore, although the comparator 104 interpolates the output voltages of the two or more preamps 102 adjacent to each other and compares the interpolated output voltages with each other in FIG. 1, it may compare the output of the preamp 102 and a comparing reference voltage with each other.

Embodiment 2

First, the configuration of an A/D converter according to Embodiment 2 of the invention will be described. Herein, the configuration of an nth preamp included in a preamp row will be described.

Figure 7:
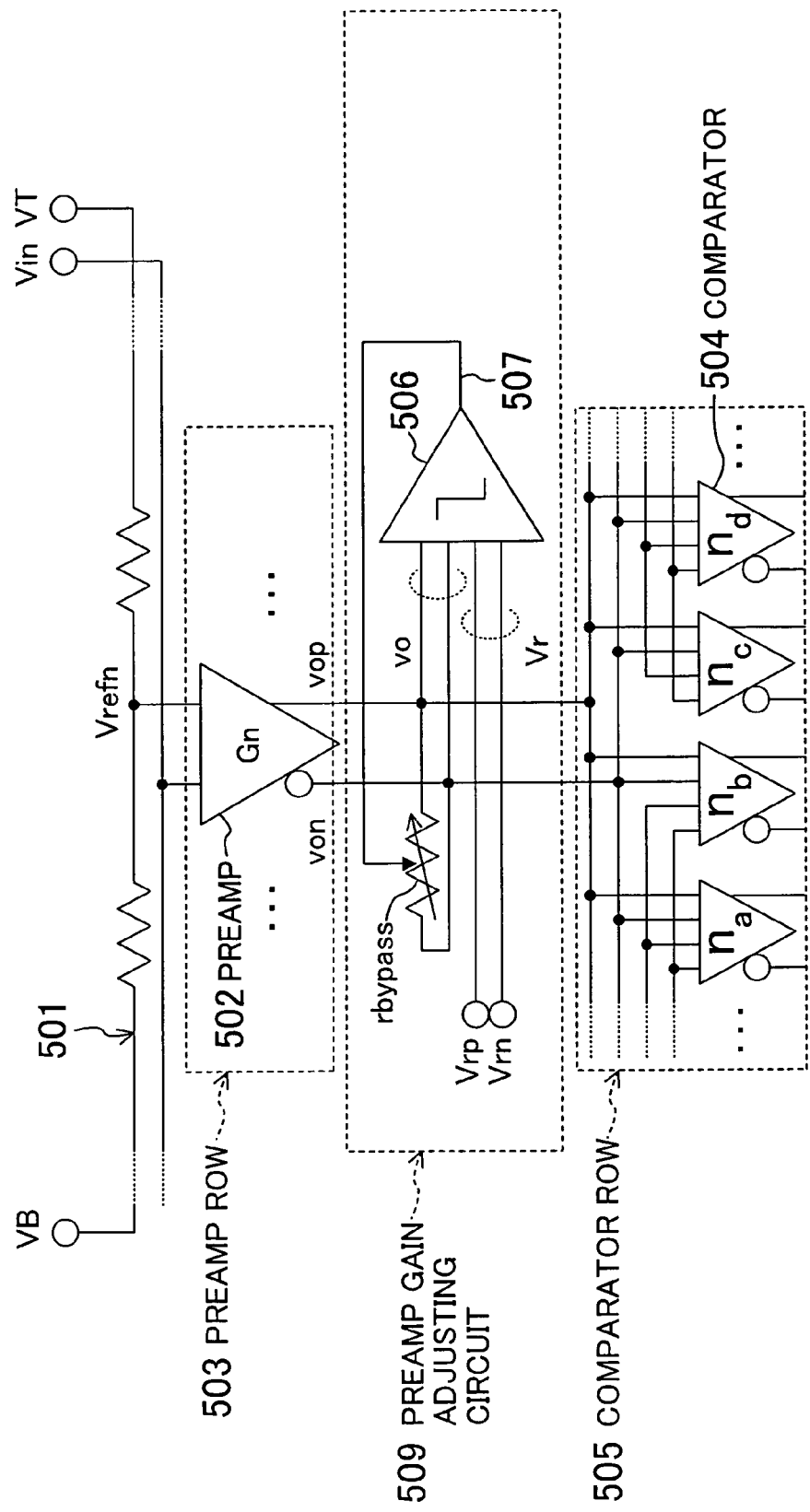
FIG. 7 is a diagram of an A/D converter according to Embodiment 2 of the invention.

FIG. 7 shows the configuration of the A/D converter of this embodiment. A reference voltage resistor row 501 is connected between minimum and maximum reference voltages VB and VT. An analog input signal vin and one reference voltage Vrefn generated by the reference voltage resistor row 501 are connected to a preamp 502. A preamp row 503 includes a group of preamps respectively connected to the analog input signal vin and different reference voltages. In this embodiment, each preamp 502 receives two inputs, that is, one analog input signal and one reference voltage, and has two output terminals, that is, a positive output terminal vop and a negative output terminal von. At this point, a potential difference between the positive output vop and the negative output von, namely, a positive-negative output potential difference of the preamp 502, is indicated as vo.

The positive output terminal vop and the negative output terminal von of the preamp 502 are connected to a comparator row 505 composed of one or more comparators 504. On the other hand, the positive output terminal vop and the negative output terminal von of the preamp 502 are connected to a preamp positive-negative output potential difference-reference potential comparator 506 together with two reference potentials Vrp and Vrn. At this point, a potential difference between the two reference potentials Vrp and Vrn is indicated as Vr. A preamp positive-negative output potential difference-reference potential comparing signal 507 corresponding to the output of the preamp positive-negative output potential difference-reference potential comparator 506 is input to a resistance control terminal of a resistance variable bypass resistor (variable resistor) rbypass connected between the positive output terminal vop and the negative output terminal von of the preamp 502. A preamp gain adjusting circuit 509 is constructed from the preamp positive-negative output potential difference-reference potential comparator 506 and the resistance variable bypass resistor rbypass. Since the preamp positive-negative output potential difference-reference potential comparator 506 can be constructed from a general differential signal comparator, the detailed circuit configuration is omitted.

FIG. 8A shows the resistance variable bypass resistor rbypass used in this A/D converter. This bypass resistor rbypass has two input terminals va and vb and a resistance control terminal 601 for receiving a resistance control signal, that is, a control signal for changing the resistance of the bypass resistor rbypass. FIG. 8B shows a further specific configuration of the resistance variable bypass resistor rbypass used in the A/D converter. The resistance variable bypass resistor rbypass is constructed from an N-channel MOS transistor Mnrby. In this case, the resistance variable bypass resistor rbypass is equivalent to the ON resistance of the N-channel MOS transistor Mnrby, and the ON resistance of the transistor Mnrby is changed by changing the voltage on the gate terminal of the transistor Mnrby, so as to realize the variable resistance. The drain terminal and the source terminal of the transistor Mnrby are respectively connected to the two input terminals va and vb, and the gate terminal thereof is connected to the resistance control terminal 601 to which the preamp positive-negative output potential difference-reference potential comparing signal corresponding to the control signal for changing the resistance of the bypass resistor rbypass is input.

The above is the configuration of the A/D converter.

Next, the operation of the A/D converter will be described. Herein, the operation related to the nth preamp 502 included in the preamp row 503 will be described.

Figure 9:
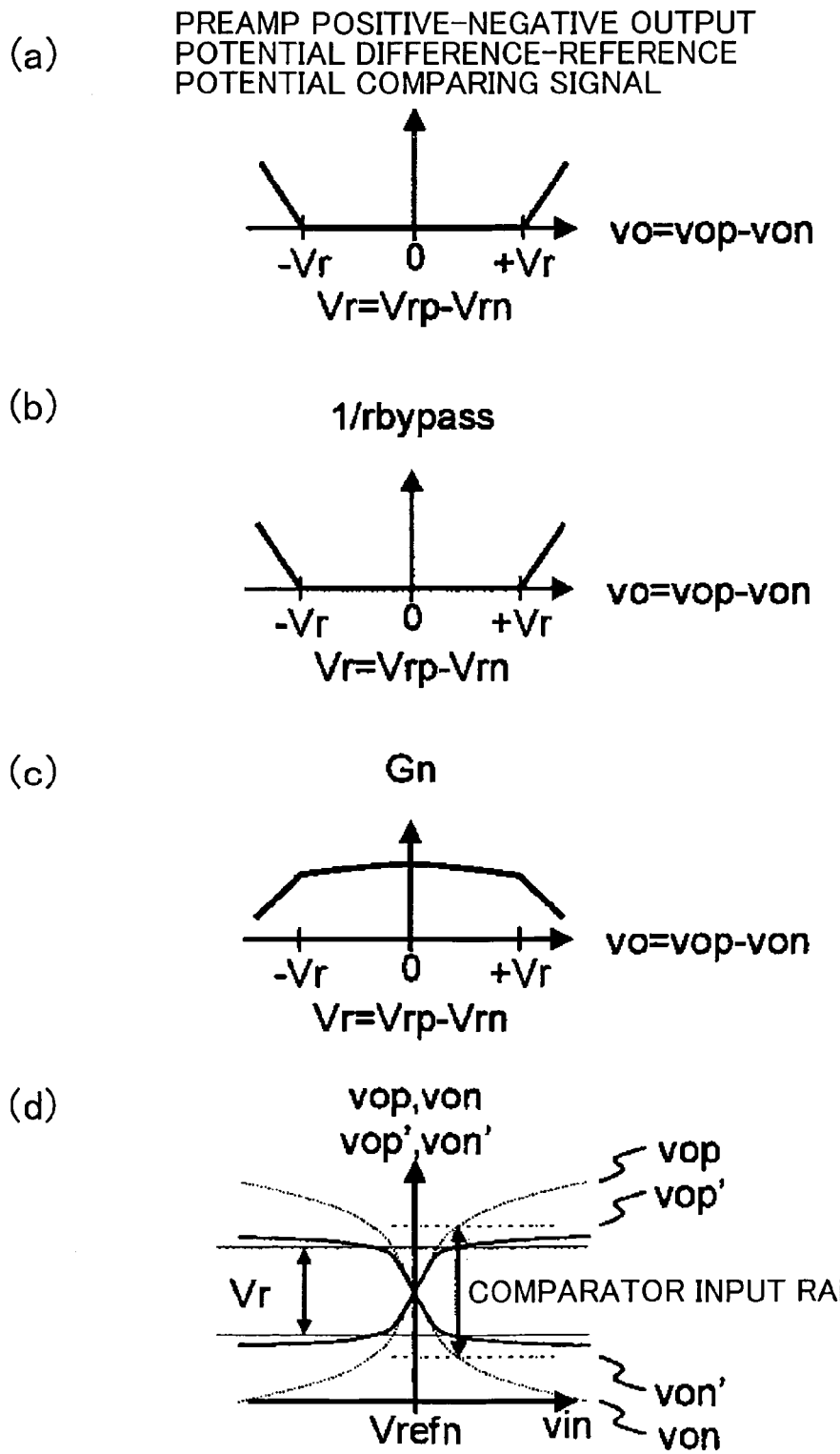
FIG. 9A is a diagram for showing the characteristic of a preamp positive-negative output potential difference-reference potential comparing signal in contrast to a positive-negative output potential difference of a preamp included in the A/D converter.
FIG. 9B is a diagram for showing the characteristic of conductance of the resistance variable bypass resistor in contrast to the positive-negative output potential difference of the preamp.
FIG. 9C is a diagram for showing the characteristic of a gain of the preamp in contrast to the positive-negative output potential difference of the preamp.
FIG. 9D is a diagram for showing the characteristics of a positive output and a negative output of the preamp in contrast to an analog input signal.

FIG. 9A shows the characteristic of the preamp positive-negative output potential difference-reference potential comparing signal in contrast to the positive-negative output potential difference vo of the preamp 502, that is, the input/output characteristic of the preamp positive-negative output potential difference-reference potential comparator 506. Specifically, it is shown in this drawing that when the positive-negative output potential difference vo of the preamp 502 exceeds the potential difference Vr between the reference potentials Vrp and Vrn, the preamp positive-negative output potential difference-reference potential comparing signal increases in the positive direction.

FIG. 9B shows the characteristic of the conductance of the resistance variable bypass resistor rbypass shown in FIG. 8 in contrast to the positive-negative output potential difference vo of the preamp 502, namely, conductance 1/rbypass. Specifically, it is shown in this drawing that when the positive-negative output potential difference vo of the preamp 502 exceeds the potential difference Vr between the reference potentials Vrp and Vrn and the preamp positive-negative output potential difference-reference potential comparing signal increases in the positive direction, the conductance 1/rbypass increases. In the case where the resistance variable bypass resistor Mnrby of FIG. 8B is exemplified, when the positive-negative output potential difference vo of the preamp 502 increases in the positive direction, namely, when vb>va, and the positive-negative output potential difference vo of the preamp 502 exceeds the potential difference Vr between the reference potentials Vrp and Vrn, the positive-negative output potential difference-reference potential comparing signal input to the resistance control terminal 601 of the resistance variable bypass resistor Mnrby increases in the positive direction. Therefore, the gate/source voltage of the transistor Mnrby increases, and hence, it is obvious that the conductance 1/rbypass of the transistor Mnrby increases.

FIG. 9C shows the characteristic of a gain Gn of the preamp 502 shown in FIG. 3 in contrast to the positive-negative output potential difference vo of the preamp 502. It is assumed that the analog input signal vin is increased. The positive-negative output potential difference vo is increased in accordance with the increase of the analog input signal vin. However, when the positive-negative output potential difference vo of the preamp 502 exceeds the potential difference Vr between the reference potentials Vrp and Vrn and the preamp positive-negative output potential difference-reference potential comparing signal increases in the positive direction, the conductance 1/rbypass of the resistance variable bypass resistor rbypass increases as described above, and accordingly, the potential difference vo between the positive output vop and the negative output von is reduced. Therefore, it is obvious that the gain Gn of the preamp 502 is reduced. Accordingly, when the positive-negative output potential difference vo of the preamp 502 exceeds the potential difference Vr between the reference potentials Vrp and Vrn and the preamp positive-negative output potential difference-reference potential comparing signal increases in the positive direction, the gain Gn of the preamp 502 reduces.

Comprehensively, FIG. 9D shows a positive output vop (a broken line) and a negative output von (a broken line) of the preamp 502 in contrast to the analog input signal vin obtained without providing the preamp gain adjusting circuit 509 and a positive output vop' (a solid line) and a negative output von' (a solid line) of the preamp 502 in contrast to the analog input signal vin obtained with the preamp gain adjusting circuit 509 provided. Specifically, owing to the function of the preamp gain adjusting circuit 509, the positive-negative output potential difference vo of the preamp 502 increases as the analog input signal vin increases, and when the positive-negative output potential difference vo of the preamp 502 exceeds the reference potential difference Vr, the gain of the preamp 502 is limited so as not to increase the positive output vop and the negative output von like the positive output vop' and the negative output von' shown with the solid lines as compared with the positive output vop and the negative output von shown with the broken lines. It is possible to design so that the positive output vop and the negative output von cannot exceed the input range of the comparator 504 depending upon the setting of the potential difference Vr between the reference potentials Vrp and Vrn.

The above is the operation of the A/D converter of this embodiment.

In this embodiment, the A/D converter including the preamp row 503 and the comparator row 505 is provided with the preamp gain adjusting circuit 509, and therefore, when the positive-negative output potential difference vo of each preamp 502 exceeds the reference potential difference Vr, the gain Gn of each preamp 502 is reduced by the preamp gain adjusting circuit 509 so as to restrict the positive-negative output potential difference vo of the preamp 502. As a result, strain of the output of the preamp 502 is reduced. Also, depending upon the setting of the reference potentials, the output range of the preamp 502 can be prevented from exceeding the input range of the comparator.

In addition, the gain Gn of the preamp 502 obtained in the vicinity of the crosspoint between the positive output and the negative output of the preamp 502 significant for the characteristics is equivalent to that of an A/D converter or the like not provided with the preamp gain adjusting circuit 509, and hence, there is no factor for degrading the characteristics of the A/D converter.

As a result, as compared with the conventional A/D converter, the characteristics of the A/D converter can be prevented from degrading even when the frequency of an input signal is higher.

In this embodiment, it goes without saying that the method for generating the reference voltages used in the A/D converter, the preamp 502, the preamp gain adjusting circuit 509 and the comparator 507 are not particularly specified and are not limited to the above description but can be variously modified within the spirit of the invention.

Although the resistance variable bypass resistor rbypass of FIG. 8A is constructed from the N-channel MOS transistor Mnrby as shown in FIG. 8B in this embodiment, it goes without saying that the same effects can be attained by using any variable resistor whose resistance is changed in accordance with any resistance control signal such as a P-channel MOS transistor Mprby shown in FIG. 8C.

Embodiment 3

Subsequently, the configuration of an A/D converter according to Embodiment 3 of the invention will be described. Herein, the configuration of an nth preamp 802 included in a preamp row 803 will be described.

Figure 10:
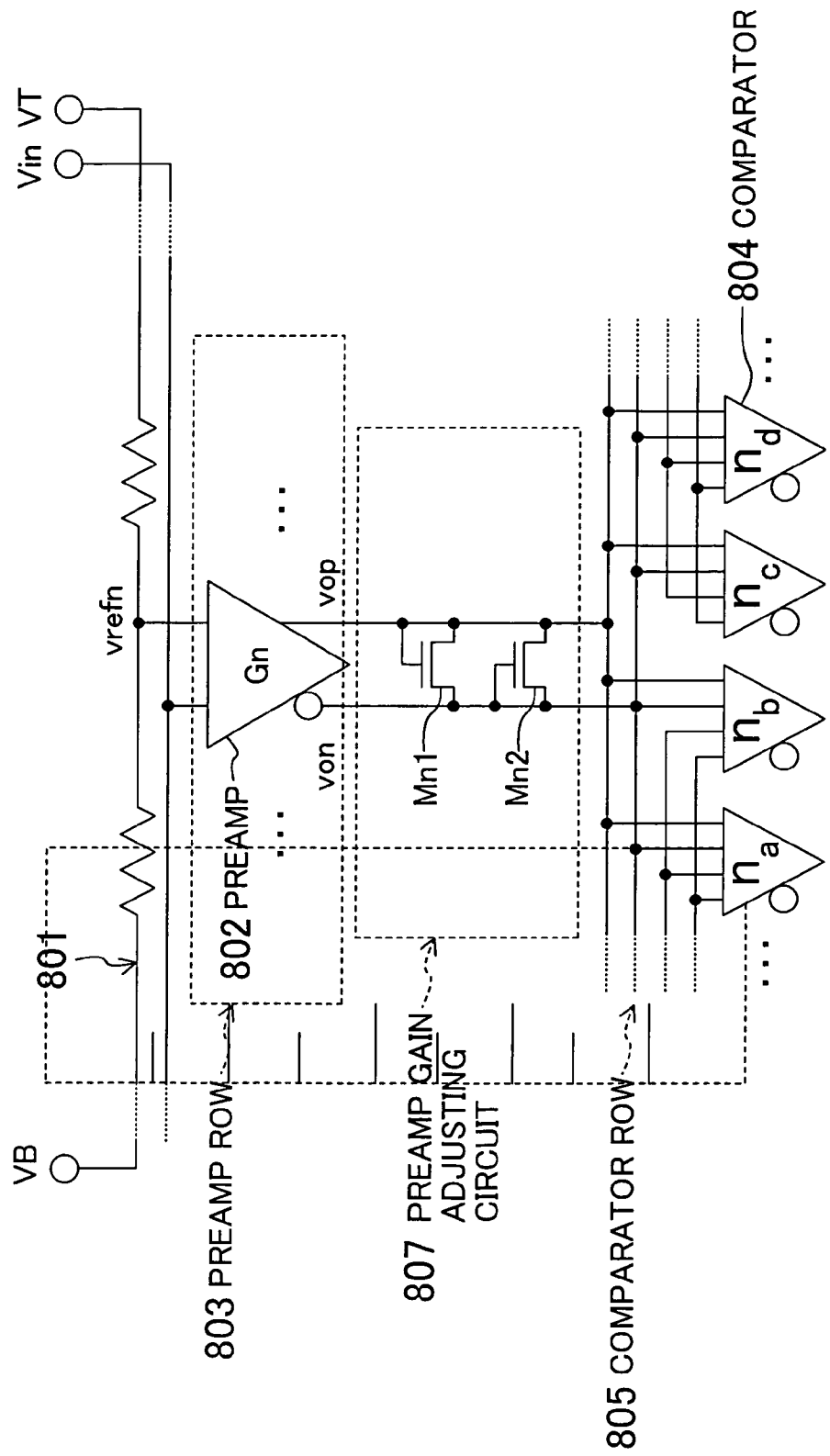
FIG. 10 is a diagram for showing the configuration of an A/D converter according to Embodiment 3 of the invention.

FIG. 10 shows the configuration of the A/D converter of this embodiment. A reference voltage resistor row 801 is connected between minimum and maximum reference voltages VB and VT. An analog input signal vin and one reference voltage Vrefn generated by the reference voltage resistor row 801 are connected to a preamp 802. The preamp row 803 includes a group of preamps respectively connected to the analog input signal vin and different reference voltages. In this embodiment, each preamp 802 receives two inputs, that is, one analog input signal and one reference voltage, and has two output terminals, that is, a positive output terminal vop and a negative output terminal von. At this point, a potential difference between the positive output vop and the negative output von, namely, a positive-negative output potential difference of the preamp 802, is indicated as vo.

The positive output terminal vop and the negative output terminal von of the preamp 802 are connected to a comparator row 805 composed of one or more comparators 804. On the other hand, the source terminals of two N-channel MOS transistors Mn1 and Mn2 are respectively connected to the negative output terminal von and the positive output terminal vop of the preamp 802, and the drain terminals and the gate terminals thereof are respectively connected to the positive output terminal vop and the negative output terminal von of the preamp 802. A preamp gain adjusting circuit 807 is constructed from the two N-channel MOS transistors Mn1 and Mn2 having the same electric characteristics.

The above is the configuration of the A/D converter.

Next, the operation of the A/D converter will be described. Herein, the operation related to the nth preamp 802 included in the preamp row 803 will be described.

FIG. 13A shows the characteristics of the conductances of the two N-channel MOS transistor Mn1 and Mn2 shown in FIG. 10 in contrast to the positive-negative output potential difference vo of the preamp 802, namely, conductances $1/r$Mn1 and $1/r$Mn2. At this point, the ON resistances of the transistors Mn1 and Mn2 are respectively the resistances of the transistors rMn1 and rMn2, and the threshold voltages of the transistors Mn1 and Mn2 are equal to be VtMn. Specifically, when the positive-negative output potential difference vo of the preamp 802 increases to exceed the threshold voltage +VtMn of the transistor Mn1, the conductance $1/r$Mn1 of the transistor Mn1 increases. Also, when the positive-negative potential difference vo of the preamp 802 reduces below the threshold voltage −VtMn of the transistor Mn2, the conductance $1/r$Mn2 of the transistor Mn2 increases. This is obvious from the characteristic of an N-channel transistor.

FIG. 13B shows the characteristic of a gain Gn of the preamp 802 shown in FIG. 10 in contrast to the positive-negative output potential difference vo of the preamp 802. It is assumed that the analog input signal vin is increased. The positive-negative output potential difference vo of the preamp 802 is increased as the increase of the analog input signal vin. However, when the positive-negative output potential difference vo of the preamp 802 exceeds the threshold voltage +VtMn of the transistor Mn1, the conductance $1/r$Mn1 of the transistor Mn1 increases as described above, and accordingly, the potential difference vo between the positive output vop and the negative output von of the preamp 802 is reduced. Alternatively, it is assumed that the analog input signal vin is reduced. The positive-negative output potential difference vo of the preamp 802 is reduced in the negative direction as the reduction of the analog input signal vin. However, when the positive-negative output potential difference vo of the preamp 802 is below the threshold voltage −VtMn of the transistor Mn2, the conductance $1/r$Mn2 of the transistor Mn2 increases as described above, and accordingly, the potential difference vo between the positive output vop and the negative output von of the preamp 802 is reduced. Accordingly, it is obvious that the gain Gn of the preamp 802 is reduced. In other words, when the positive-negative output potential difference vo of the preamp 802 exceeds the threshold voltages +/−VtMn of the transistors Mn1 and Mn2, the gain Gn of the preamp 802 reduces.

Comprehensively, FIG. 13C shows a positive output vop (a broken line) and a negative output von (a broken line) of the preamp 802 in contrast to the analog input signal vin obtained without providing the preamp gain adjusting circuit 807 and a positive output vop' (a solid line) and a negative output von'

(a solid line) of the preamp 802 in contrast to the analog input signal vin obtained with the preamp gain adjusting circuit 807 provided. Specifically, owing to the function of the preamp gain adjusting circuit 807, the positive-negative output potential difference vo of the preamp 802 increases as the analog input signal vin increases, and when the positive-negative output potential difference vo of the preamp 802 exceeds the threshold voltages +/−VtMn of the transistors Mn1 and Mn2, the gain of the preamp 802 is limited so as not to increase the positive output vop and the negative output von like the positive output vop' and the negative output von' shown with the solid lines as compared with the positive output vop and the negative output von shown with the broken lines.

The above is the operation of the A/D converter of this embodiment.

In this embodiment, the A/D converter including the preamp row 803 and the comparator row 805 is provided with the preamp gain adjusting circuit 807, and therefore, when the positive-negative output potential difference vo of each preamp 802 exceeds the threshold voltage +VtMn of the transistors Mn1 and Mn2 or is smaller than the threshold voltage −VtMn of the transistors Mn1 and Mn2, the gain Gn of each preamp 802 is reduced by the preamp gain adjusting circuit 807 so as to restrict the positive-negative output potential difference vo of the preamp 802. As a result, strain of the output of the preamp 802 is reduced. Also, depending upon the threshold voltages VtMn of the transistors Mn1 and Mn2, the output range of the preamp 802 can be prevented from exceeding the input range of the comparator 804.

In addition, the gain Gn of the preamp 802 obtained in the vicinity of the crosspoint between the positive output vop and the negative output of the preamp 802 significant for the characteristics is equivalent to that of an A/D converter or the like not provided with the preamp gain adjusting circuit 807, and hence, there is no factor for degrading the characteristics of the A/D converter.

As a result, as compared with the conventional A/D converter, the characteristics of the A/D converter can be prevented from degrading even when the frequency of an input signal is higher.

In this embodiment, it goes without saying that the method for generating the reference voltages used in the A/D converter, the preamp 802, the preamp gain adjusting circuit 807 and the comparator 804 are not particularly specified and are not limited to the above description but can be variously modified within the spirit of the invention.

Figure 11:
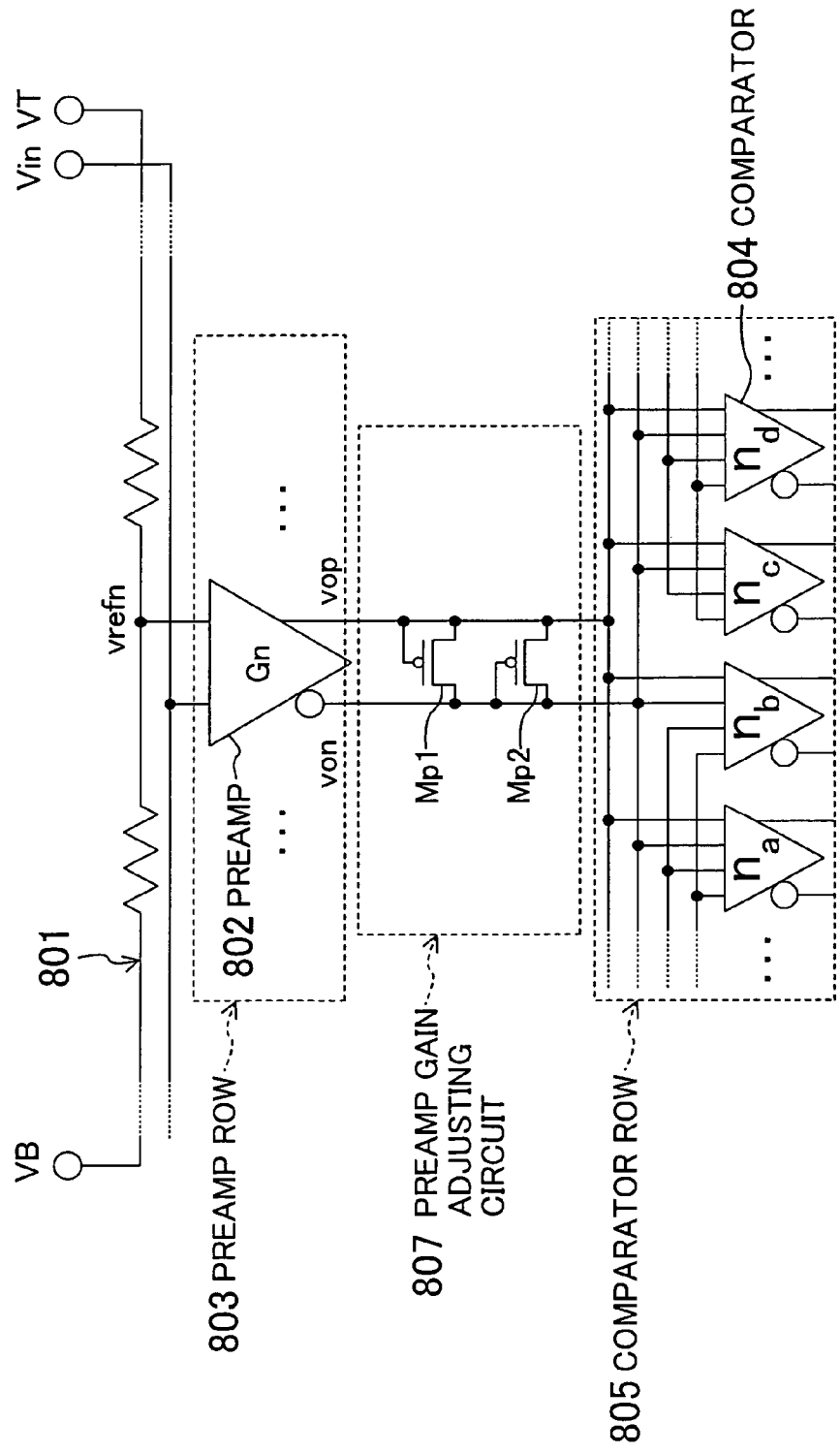
FIG. 11 is a diagram of a first modification of the A/D converter.
Figure 12:
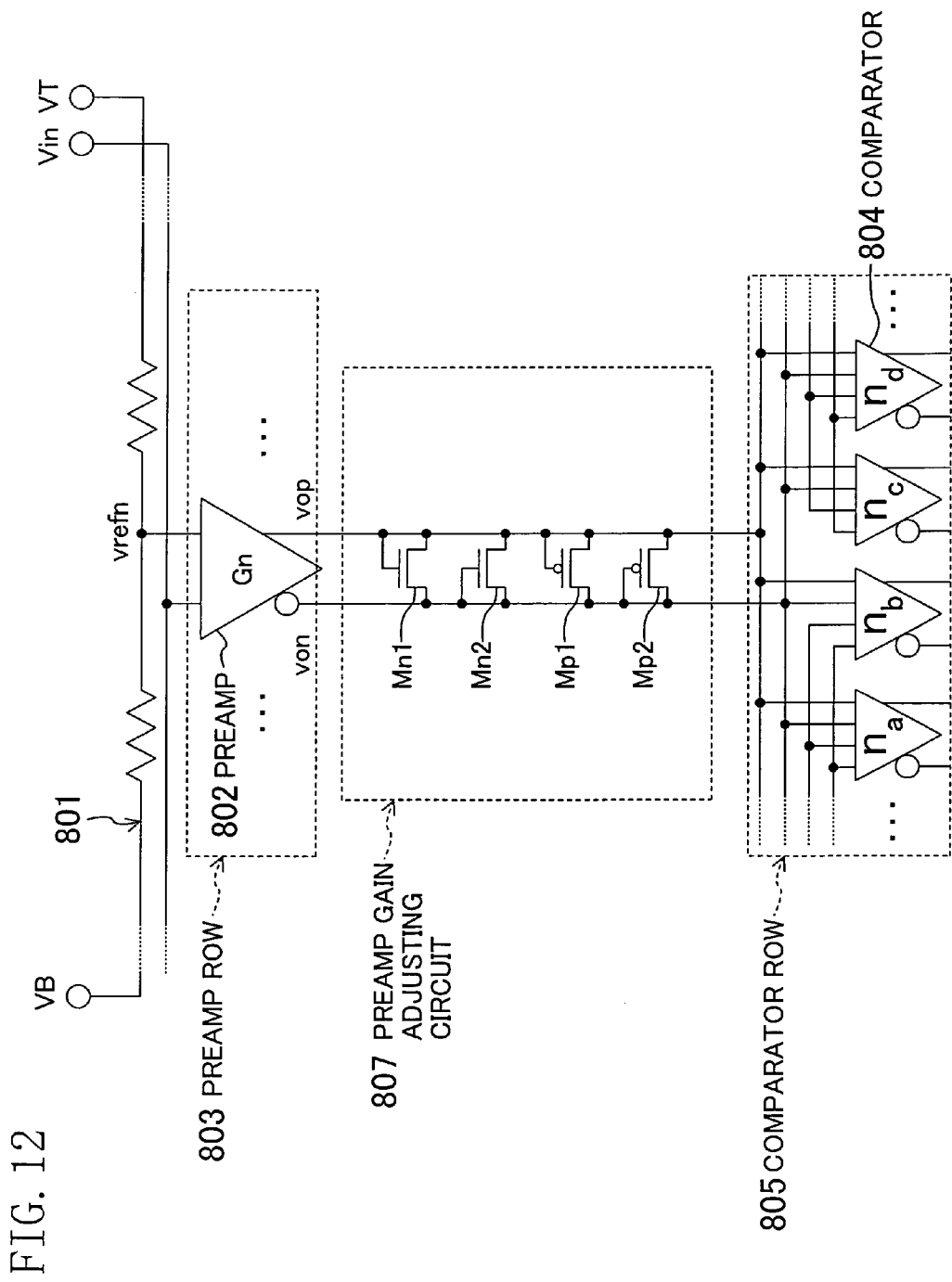
FIG. 12 is a diagram of a second modification of the A/D converter.
Figure 14:
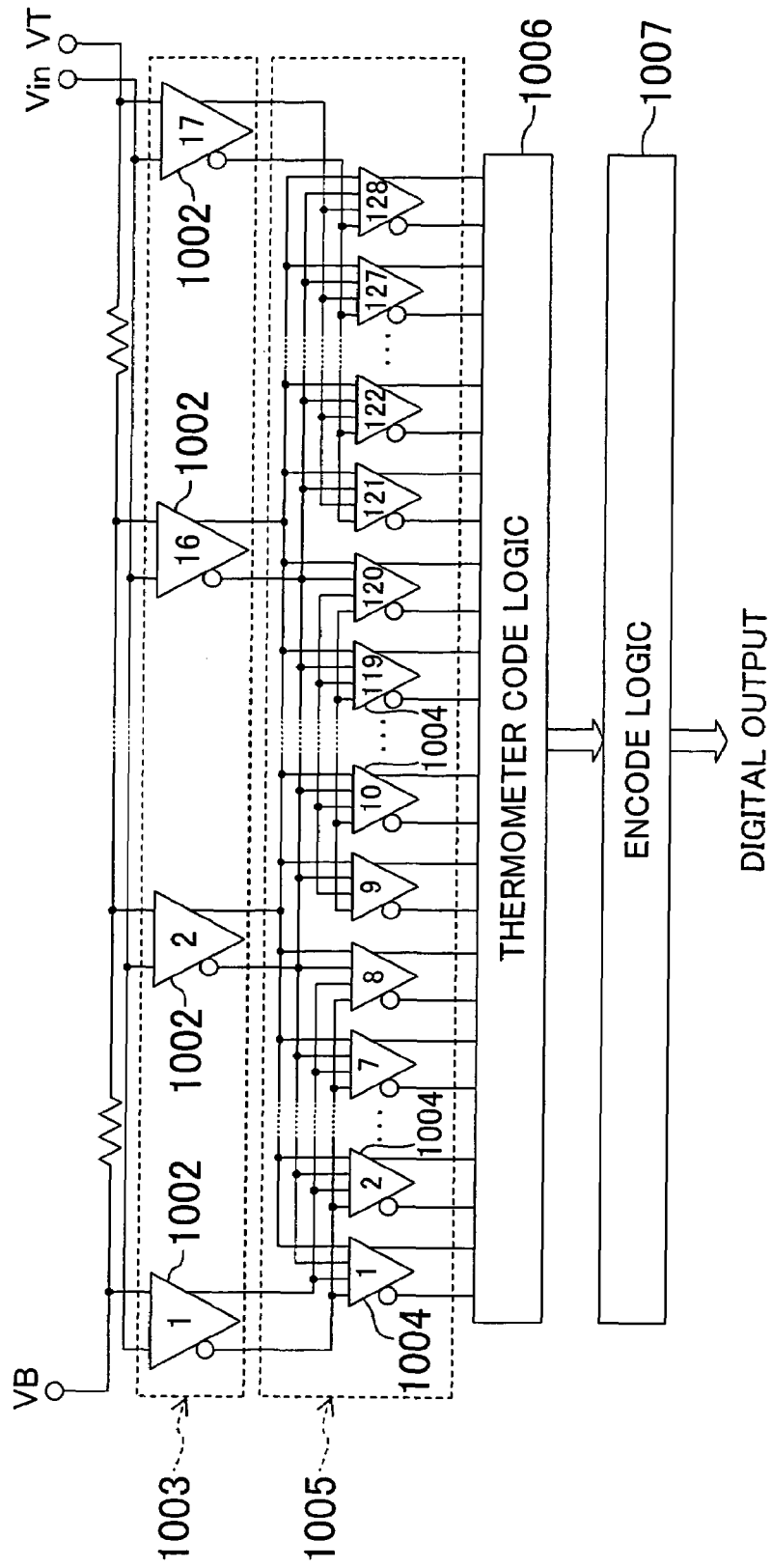
FIG. 14 is a diagram for showing the configuration of a conventional A/D converter.

For example, although the preamp gain adjusting circuit 807 is constructed from the two N-channel MOS transistors Mn1 and Mn2 as shown in FIG. 10 in this embodiment, it goes without saying that the same effects can be attained when it is constructed from two P-channel MOS transistors Mp1 and Mp2 having the same electric characteristics as shown in FIG. 11, or when the configurations of FIGS. 10 and 11 are combined, namely, when it is constructed from two N-channel MOS transistors Mn1 and Mn2 and two P-channel MOS transistors Mp1 and Mp2 respectively having the same electric characteristics as shown in FIG. 12.

INDUSTRIAL APPLICABILITY

As described so far, according to the present invention, an A/D converter including a preamp row and a comparator row is provided with a preamp gain adjusting circuit, so as to prevent characteristic degradation of the A/D converter as compared with a conventional A/D converter even when the frequency of an input signal is higher. Therefore, the invention is applicable in the communication field where an A/D converter is required of a fast operation and a high input band or applicable to a front end portion of an information media reader.

The invention claimed is:

1. An A/D converter comprising a preamp row including one or more preamps and a comparator row including one or more comparators,
    wherein each preamp of said preamp row receives, as inputs, a reference voltage or difference-reference voltages and an analog input signal or differential analog input signals and has a positive output terminal and a negative output terminal,
    said preamp has a function to multiply, by a gain thereof, a potential difference between said reference voltage and said analog input signal or a potential difference between a potential difference between said difference-reference voltages and a potential difference between said differential analog input signals and to output said potential difference having multiplied by the gain from said positive output terminal and said negative output terminal as differential outputs,
    each comparator of said comparator row is connected to said positive output terminal and said negative output terminal of each preamp,
    said comparator has a function to compare an output of said preamp with a comparing reference voltage, or to interpolate output voltages of said positive output terminals and said negative output terminals of two or more preamps adjacent to each other and compare said interpolated voltages,
    each of said preamps is correspondingly provided with a preamp gain adjusting circuit, and
    said preamp gain adjusting circuit reduces the gain of said corresponding preamp when a preamp positive-negative output potential difference that is a potential difference between said positive output terminal and said negative output terminal of said corresponding preamp exceeds a reference potential.

2. The A/D converter of claim 1,
    wherein said preamp gain adjusting circuit includes:
        a preamp positive-negative output potential difference-reference potential comparator for comparing said preamp positive-negative output potential difference and said reference potential with each other and outputting a preamp positive-negative output potential difference-reference potential comparing signal; and
        a sub-bias circuit for generating a bias voltage to be supplied to a bias current source included in said corresponding preamp, and
    said sub-bias circuit changes a bias current of said bias current source by changing the bias voltage to be supplied to said bias current source of said corresponding preamp, whereby changing the gain of said corresponding preamp.

3. The A/D converter of claim 1,
    wherein said preamp gain adjusting circuit includes:
        a preamp positive-negative output potential difference-reference potential comparator for comparing said preamp positive-negative output potential difference and said reference potential with each other and outputting a preamp positive-negative output potential difference-reference potential comparing signal; and
        one or more variable resistors,
    each of said variable resistors has two input/output terminals and a resistance control terminal,
    one of said input/output terminals of said variable resistor is connected to said positive output terminal of said preamp, the other of said input/output terminals of said variable resistor is connected to said negative output terminal of said preamp and said resistance control terminal of said variable resistor receives said positive-negative output potential difference-reference potential comparing signal of said corresponding preamp, and an ON resistance of said variable resistor is changed in accordance with said positive-negative output potential difference-reference potential comparing signal received at said resistance control terminal of said variable resistor, whereby changing the gain of said corresponding preamp.

4. The A/D converter of claim 3, wherein each of said variable resistors includes one N-channel MOS transistor, a source terminal or a drain terminal of said N-channel MOS transistor is connected to said positive output terminal of said corresponding preamp, the drain terminal or the source terminal thereof is connected to said negative output terminal of said corresponding preamp and a gate electrode thereof receives said preamp positive-negative output potential difference-reference potential comparing signal, and an ON resistance of said N-channel MOS transistor is changed in accordance with said preamp positive-negative output potential difference-reference potential comparing signal received at the gate terminal, whereby changing the gain of said corresponding preamp.

5. The A/D converter of claim 3, wherein each of said variable resistor includes one P-channel MOS transistor, a source terminal or a drain terminal of said P-channel MOS transistor is connected to said positive output terminal of said corresponding preamp, the drain terminal or the source terminal thereof is connected to said negative output terminal of said corresponding preamp and a gate electrode thereof receives said preamp positive-negative output potential difference-reference potential comparing signal, and an ON resistance of said P-channel MOS transistor is changed in accordance with said preamp positive-negative output potential difference-reference potential comparing signal received at the gate terminal, whereby changing the gain of said corresponding preamp.

6. The A/D converter of claim 1, wherein said preamp gain adjusting circuit includes two N-channel MOS transistors, one of said two N-channel MOS transistors is connected to said positive output terminal of said corresponding preamp at a source terminal or a drain terminal thereof and is connected to said negative output terminal of said corresponding preamp at the drain terminal or the source terminal and a gate terminal thereof, the other of said two N-channel MOS transistors is connected to said negative output terminal of said corresponding preamp at a source terminal or a drain terminal thereof and is connected to said positive output terminal of said corresponding preamp at the drain terminal or the source terminal and a gate terminal thereof, and said preamp gain adjusting circuit changes the gain of said corresponding preamp.

7. The A/D converter of claim 1, wherein said preamp gain adjusting circuit includes two P-channel MOS transistors, one of said two P-channel MOS transistors is connected to said positive output terminal of said corresponding preamp at a source terminal or a drain terminal thereof and is connected to said negative output terminal of said corresponding preamp at the drain terminal or the source terminal and a gate terminal thereof, the other of said two P-channel MOS transistors is connected to said negative output terminal of said corresponding preamp at a source terminal or a drain terminal thereof and is connected to said positive output terminal of said corresponding preamp at the drain terminal or the source terminal and a gate terminal thereof, and said preamp gain adjusting circuit changes the gain of said corresponding preamp.

8. The A/D converter of claim 1, wherein said preamp gain adjusting circuit includes two N-channel MOS transistors and two P-channel MOS transistors, one of said two N-channel MOS transistors is connected to said positive output terminal of said corresponding preamp at a source terminal or a drain terminal thereof and is connected to said negative output terminal of said corresponding preamp at the drain terminal or the source terminal and a gate terminal thereof, the other of said two N-channel MOS transistors is connected to said negative output terminal of said corresponding preamp at a source terminal or a drain terminal thereof and is connected to said positive output terminal of said corresponding preamp at the drain terminal or the source terminal and a gate terminal thereof, one of said two P-channel MOS transistors is connected to said positive output terminal of said corresponding preamp at a source terminal or a drain terminal thereof and is connected to said negative output terminal of said corresponding preamp at the drain terminal or the source terminal and a gate terminal thereof, the other of said two P-channel MOS transistors is connected to said negative output terminal of said corresponding preamp at a source terminal or a drain terminal thereof and is connected to said positive output terminal of said corresponding preamp at the drain terminal or the source terminal and a gate terminal thereof, and said preamp gain adjusting circuit changes the gain of said corresponding preamp.

* * * * *